(12) United States Patent
Jung

(10) Patent No.: US 11,314,367 B2
(45) Date of Patent: Apr. 26, 2022

(54) DIGITIZER AND DISPLAY DEVICE INCLUDING THE SAME

(71) Applicant: Samsung Display Co., Ltd., Yongin-si (KR)

(72) Inventor: Sung-Ki Jung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/152,701

(22) Filed: Jan. 19, 2021

(65) Prior Publication Data

US 2021/0333944 A1    Oct. 28, 2021

(30) Foreign Application Priority Data

Apr. 28, 2020    (KR) .................. 10-2020-0051395

(51) Int. Cl.
| | | |
|---|---|---|
| *G06F 3/044* | (2006.01) | |
| *H05K 1/02* | (2006.01) | |
| *H01L 27/32* | (2006.01) | |
| *H01L 51/00* | (2006.01) | |
| *H01L 51/52* | (2006.01) | |

(52) U.S. Cl.
CPC .......... *G06F 3/0446* (2019.05); *H01L 27/323* (2013.01); *H01L 27/3244* (2013.01); *H01L 51/0097* (2013.01); *H01L 51/5253* (2013.01); *H05K 1/028* (2013.01); *H05K 1/0296* (2013.01); *G06F 2203/04102* (2013.01); *H01L 2251/5338* (2013.01); *H05K 2201/10128* (2013.01)

(58) Field of Classification Search
CPC ............... H01L 27/3244; H01L 27/323; H01L 51/5253; H01L 51/0097; H01L 2251/5338; G06F 3/0446; G06F 2203/04102; H05K 1/0296; H05K 1/028; H05K 2201/10128
USPC ....................................................... 345/174
See application file for complete search history.

(56) References Cited

U.S. PATENT DOCUMENTS

| | | | |
|---|---|---|---|
| 9,048,443 B2 | 6/2015 | Namkung et al. | |
| 9,069,521 B2 | 6/2015 | Lee et al. | |
| 2012/0299850 A1* | 11/2012 | Lee | G06F 3/046 345/173 |
| 2016/0062516 A1* | 3/2016 | Jeong | G06F 1/1643 345/174 |

(Continued)

FOREIGN PATENT DOCUMENTS

| | | |
|---|---|---|
| KR | 10-2015-0007632 | 1/2015 |
| KR | 10-2016-0144912 | 12/2016 |
| KR | 10-1687158 | 12/2016 |

(Continued)

*Primary Examiner* — Jimmy H Nguyen
(74) *Attorney, Agent, or Firm* — H.C. Park & Associates, PLC

(57) ABSTRACT

A digitizer including a flexible printed circuit film including a folding area configured to be folded, and having a first surface and a second surface opposite to the first surface, a plurality of first lines disposed on the first surface of the flexible printed circuit film and extending in a first direction, and a plurality of second lines disposed on the second surface of the flexible printed circuit film and extending in a second direction crossing the first direction, in which the first lines and the second lines define a grid area overlapping the folding area on a plane, and the flexible printed circuit film includes a penetration hole in the grid area.

20 Claims, 11 Drawing Sheets

(56) References Cited

U.S. PATENT DOCUMENTS

2019/0129553 A1* 5/2019 Oh .......................... G06F 3/041

FOREIGN PATENT DOCUMENTS

| KR | 10-1749861 | 6/2017 |
| KR | 10-1910111 | 10/2018 |
| KR | 10-1986762 | 6/2019 |

* cited by examiner

FIG. 2
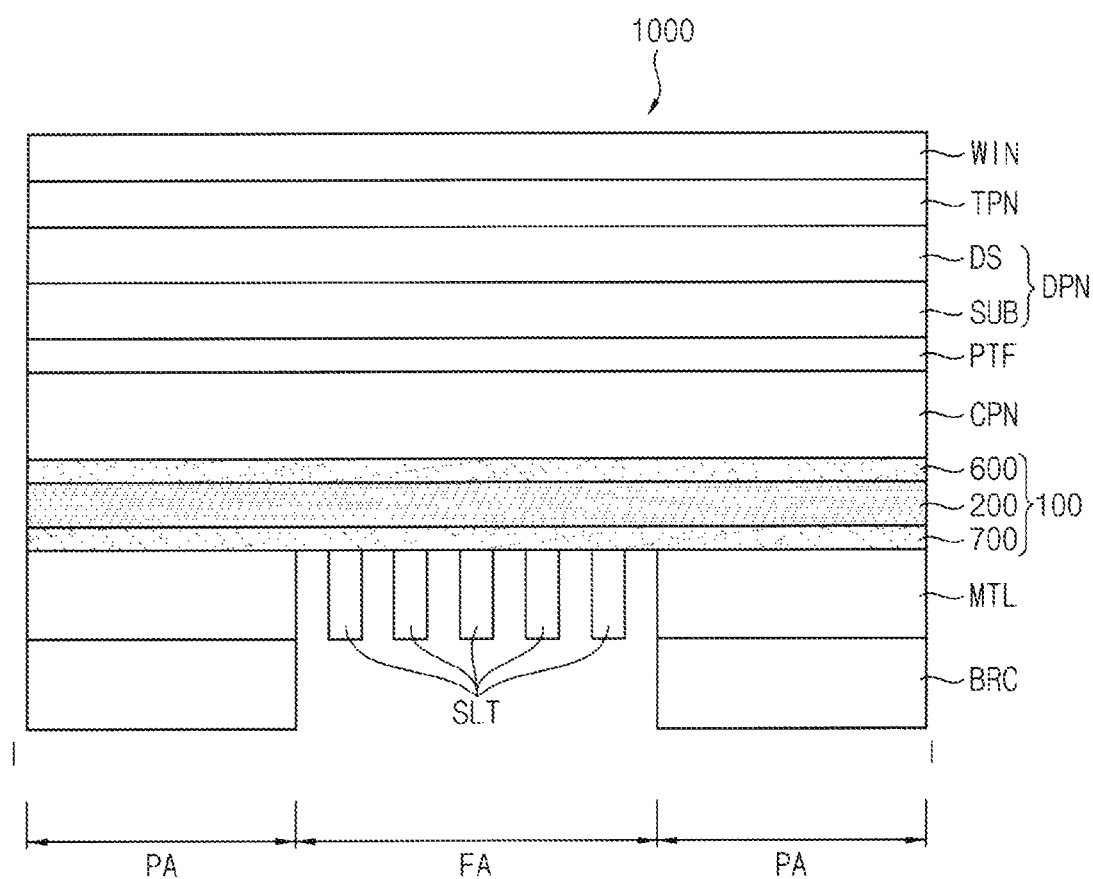
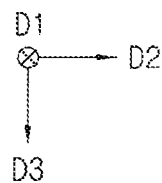

DIGITIZER AND DISPLAY DEVICE INCLUDING THE SAME

CROSS-REFERENCE TO RELATED APPLICATION

This application claims priority from and the benefit of Korean Patent Application No. 10-2020-0051395, filed on Apr. 28, 2020, which is hereby incorporated by reference for all purposes as if fully set forth herein.

BACKGROUND

Field

Exemplary embodiments of the invention relate generally to a digitizer and a display device including the digitizer and, more specifically, to a digitizer with a penetration hole and the display device including the digitizer.

Discussion of the Background

A display device may include at least one of a touch panel for sensing a touch by a user's hand and a digitizer for sensing a touch by an electromagnetic pen. The digitizer may be operated in various ways, such as an electromagnetic resonance ("EMR") method, a reduced pressure method, and a capacitance method. In the case of the electromagnetic resonance method, touch coordinates may be recognized by electromagnetic resonance between the digitizer and the electromagnetic pen.

Recently, a demand for a foldable display device capable of folding and unfolding the display device have been steadily increasing. Accordingly, the digitizer may need to be adapted to the foldable display device.

The above information disclosed in this Background section is only for understanding of the background of the inventive concepts, and, therefore, it may contain information that does not constitute prior art.

SUMMARY

Digitizers and display devices including the same constructed according to exemplary embodiments of the invention have a penetration hole.

Additional features of the inventive concepts will be set forth in the description which follows, and in part will be apparent from the description, or may be learned by practice of the inventive concepts.

A digitizer according to an exemplary embodiment includes a flexible printed circuit film including a folding area configured to be folded, and having a first surface and a second surface opposite to the first surface, a plurality of first lines disposed on the first surface of the flexible printed circuit film and extending in a first direction, and a plurality of second lines disposed on the second surface of the flexible printed circuit film and extending in a second direction crossing the first direction, in which the first lines and the second lines define a grid area overlapping the folding area on a plane, and the flexible printed circuit film includes a penetration hole in the grid area.

The penetration hole may have substantially a rectangular shape on a plane.

The digitizer may further include a first step compensation layer disposed on the first surface of the flexible printed circuit film and covering the penetration hole.

The digitizer may further include a filling member disposed inside of the penetration hole.

The filling member may include at least one of polyurethane, thermoplastic polyurethane, latex, acrylic resin, polyurethane foam, and polystyrene foam.

The first step compensation layer may include substantially the same material as the filling member.

The first step compensation layer may include an adhesive.

The adhesive may include at least one of an optically transparent adhesive, an optically transparent resin, and a pressure-sensitive adhesive.

The first compensation layer may further cover the first lines.

The digitizer may further include a second compensation layer disposed on the second surface of the flexible printed circuit film and covering the penetration hole.

The penetration hole may include a first penetration hole having substantially a U-shape on a plane, and a second penetration hole having a shape substantially symmetrical to the first penetration hole with respect to a center of the grid area.

A display device according to another exemplary embodiment includes a display panel including a substrate and a display structure disposed on the substrate, and a digitizer disposed under the display panel, the digitizer including a flexible printed circuit film including a folding area configured to be folded, a plurality of first lines disposed on the flexible printed circuit film and extending in a first direction, and a plurality of second lines disposed under the flexible printed circuit film and extending in a second direction crossing the first direction, in which the first lines and the second lines may define a grid area overlapping the folding area on a plane, and the flexible printed circuit film may include a penetration hole in the grid area.

The penetration hole may have substantially a rectangular shape on a plane.

The digitizer may further include a first step compensation layer disposed on a first surface of the flexible printed circuit film and covering the penetration hole.

The digitizer may further include a filling member disposed inside of the penetration hole.

The first step compensation layer may include substantially the same material as the filling member.

The first step compensation layer may include an adhesive.

The digitizer may further include a second compensation layer disposed on a second surface of the flexible printed circuit film and covering the penetration hole.

The display device may further include a touch panel disposed on the display panel.

The display device may further include a protection film disposed between the display panel and the digitizer, a buffer member disposed between the protection film and the digitizer, and a support member disposed under the digitizer and including a plurality of slits in an area overlapping the folding area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 2 is a cross-sectional view taken along line I-I' of FIG. 1.

DETAILED DESCRIPTION

Figure 1:
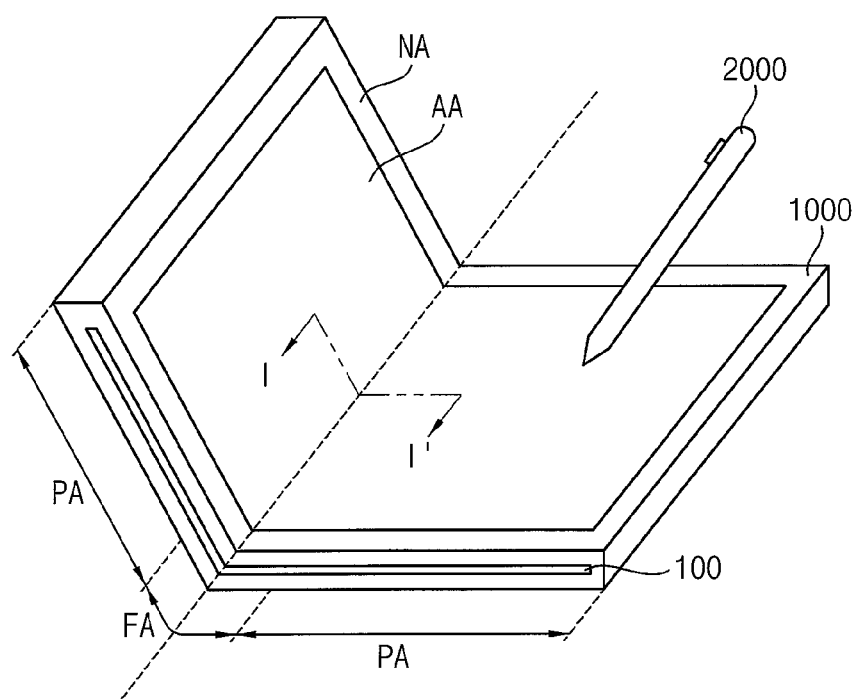
FIG. 1 is a diagram illustrating a display device according to an exemplarily embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a diagram illustrating a display device according to an exemplary embodiment. FIG. 2 is a cross-sectional view taken along line I-I' of FIG. 1.

Referring to FIGS. 1 and 2, the display device 1000 according to an exemplary embodiment may be divided into an active area AA and an inactive area NA. For example, as shown in FIG. 1, the display device 1000 may be divided into the active area AA and the non-active area NA surrounding the active area AA on a plane. A digitizer 100 may be disposed in the active area AA. When an input unit 2000 approaches the active area AA by a user, the input unit 2000 and the digitizer 100 may communicate with each other to perform various input functions. For example, the input unit 2000 may be an electromagnetic pen.

In addition, the display device 1000 may be divided into a folding area FA and a flat area PA. For example, as shown in FIG. 1, the display device 1000 may be divided into the folding area FA and the flat area PA adjacent to the folding area FA. The display device 1000 in the flat area PA may not be folded.

The folding area FA may be an area in which the display device 1000 may be folded and unfolded. The folding area FA and the active area AA may overlap each other. Accordingly, even when the digitizer 100 approaches the folding area FA of the input unit 2000, the input unit 2000 and the digitizer 100 may communicate with each other. When the display device 1000 is folded, components (e.g., the digitizer 100) of the display device 1000 overlapping the folding area FA may be folded together.

The display device 1000 may include the digitizer 100, a buffer member CPN, a protection film PTF, a display panel DPN, a touch panel TPN, a window WIN, a support member MTL, and a bracket BRC.

The digitizer 100 may communicate with the input unit 2000 and may detect an approach of the input unit 2000. For example, the digitizer 100 may be implemented in an electromagnetic resonance ("EMR") method, a reduced pressure method, a capacitance method, or a combination thereof. Meanwhile, as a part of the digitizer 100 overlaps the folding area FA, when the display device 1000 is folded, the digitizer 100 may be folded together. The digitizer 100 will be described in more detail below with reference to FIG. 3.

The buffer member CPN may be disposed on the digitizer 100. The buffer member CPN may protect the display panel DPN by buffering an external shock applied to the display panel DPN. For example, the buffer member CPN may include a material capable of buffering by containing air, such as a cushion and a sponge. In addition, in order to facilitate folding and unfolding of the display panel DPN, the buffer member CPN may include a flexible material. For example, the buffer member CPN may include at least one of polyurethane, thermoplastic polyurethane, latex, acrylic resin, polyurethane foam, and polystyrene foam.

The protection film PTF may be disposed on the buffer member CPN. The protection film PTF may prevent penetration of moisture and oxygen from an outside and may absorb an external shock. In order to implement a flexible display device, the display panel DPN may include a plastic substrate SUB which is flexible, and the protection film PTF may support the plastic substrate SUB.

In addition, the protection film PTF may overlap the folding area FA. Accordingly, the protection film PTF may prevent the plastic substrate SUB from being deformed in the folding area FA.

For example, the protection film PTF may be a plastic film, such as polyethersulfone ("PS"), polyacrylate ("PAR"), polyetherimide ("PEI"), polyethylenenaphthalate ("PEN"), polyphenylene sulfide ("PPS"), polyarylate ("PA"), polycarbonate ("PC"), poly(arylene ethersulfone)), polyethylene terephthalate ("PET"), polyimide ("PI"), and the like.

The display panel DPN may include the plastic substrate SUB and a plurality of display structures DS disposed on the plastic substrate SUB. The plastic substrate SUB may contact the protection film PTF. Each of the display structures DS may include a plurality of transistors and a light emitting diode disposed on the transistors. In an exemplary embodiment, the light emitting diode may be an organic light emitting diode. For example, the transistors may transfer a driving current to the organic light emitting diode, and the organic light emitting diode may emit light by receiving the driving current.

The touch panel TPN may be disposed on the display panel DPN. In an exemplary embodiment, the touch panel TPN may sense a touch by a user's hand. The touch panel TPN may be implemented as a pressure-sensitive method, a resistive method, a capacitive method, an infrared method, an ultrasonic method, or a combination thereof. For example, the touch panel TPN may include a plurality of transmission electrodes and a plurality of reception electrodes. The touch panel TPN may detect a user's touch by detecting a change in capacitance inside the touch panel TPN due to the user's touch.

The window WIN may be disposed on the touch panel TPN. The window WIN may be a front surface of the display device 1000 and may protect the display panel DPN and the touch panel TPN. In order to implement a foldable display device, the window WIN may include polymethyl methacrylate ("PMMA"), polyethylene terephtalate ("PET"), or the like.

The support member MTL may be disposed under the digitizer 100. The support member MTL may support the display panel DPN. As such, the support member MTL may include a material having rigidity. For example, the support member MTL may include a metallic material, such as INVAR®, which is an alloy of nickel ("Ni") and iron ("Fe"), stainless steel ("SUS"), titanium ("Ti"), copper ("Cu").

In addition, the support member MTL may include a plurality of slits SLT overlapping the folding area FA. Since the support member MTL includes the slits SLT, the support member MTL may allow the display panel DPN to be easily folded and unfolded repeatedly. In addition, the slits SLT overlapping the folding area FA may prevent wrinkles from occurring in an upper surface of the window WIN overlapping the folding area FA.

The bracket BRC may be disposed on a lower surface of the support member MTL. The bracket BRC may be disposed at the lowermost portion of the display device 1000 to protect the display device 1000. For example, the bracket BRC may further cover a side surface of the display device 1000. In addition, the bracket BRC may include an opening overlapping the folding area FA.

Figure 3:
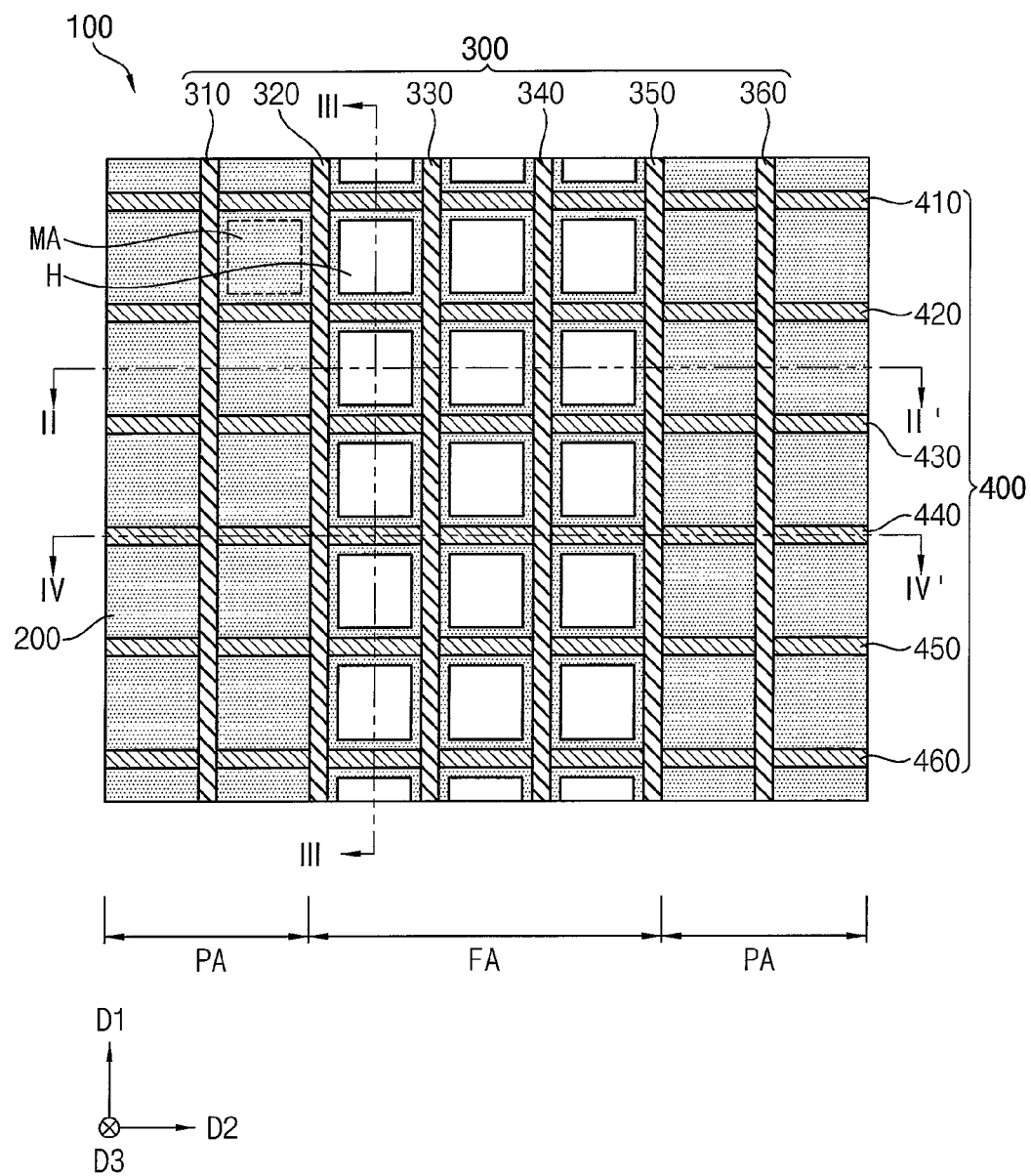
FIG. 3 is a plan view of a digitizer included in the display device of FIG. 1 according to an exemplary embodiment.
Figure 4:
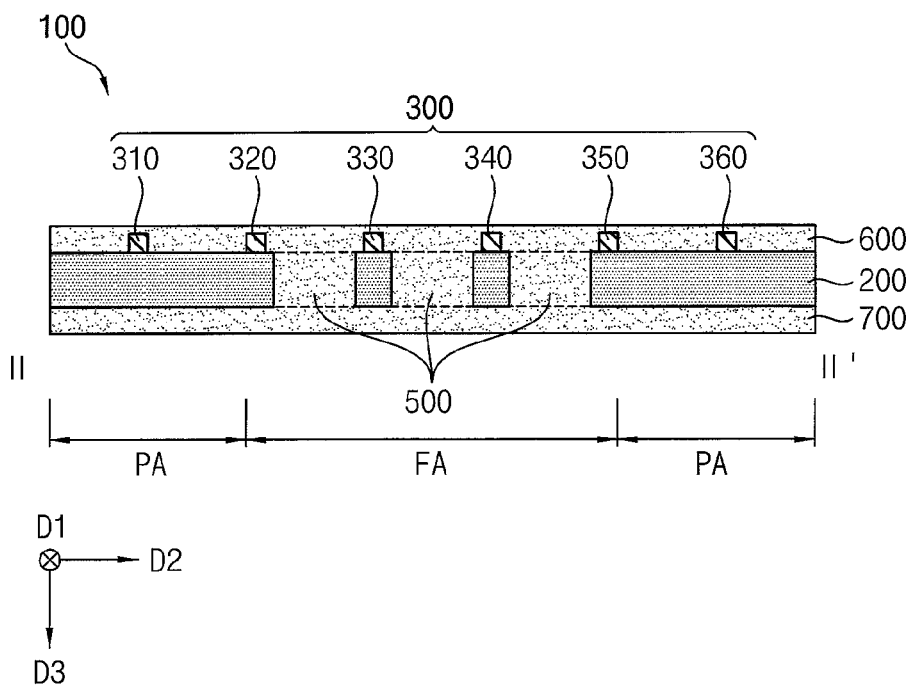
FIG. 4 is a cross-sectional view taken along line II-II' of FIG. 3.
Figure 5:
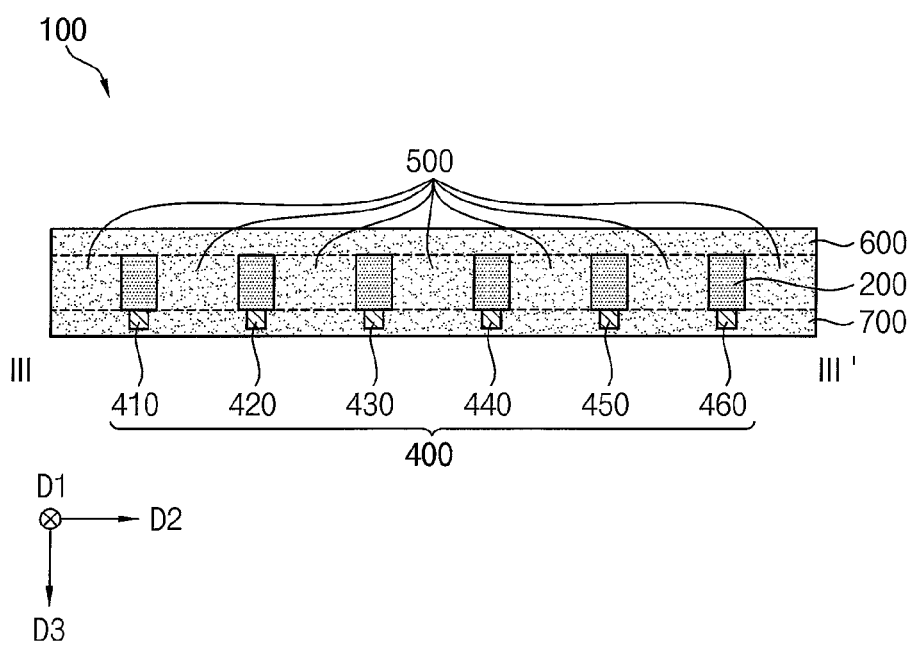
FIG. 5 is a cross-sectional view taken along line III-III' of FIG. 3.
Figure 6:
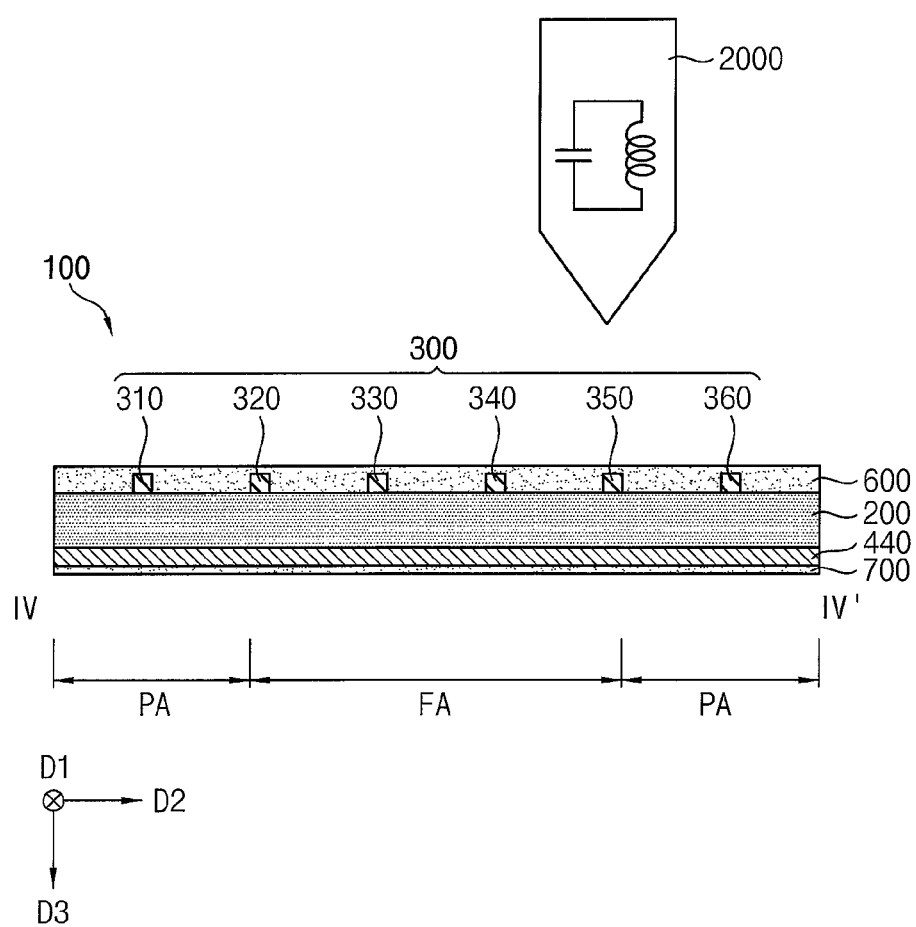
FIG. 6 is a cross-sectional view taken along line IV-IV' of FIG. 3.

FIG. 3 is a plan view of a digitizer included in the display device of FIG. 1 according to an exemplary embodiment. FIG. 4 is a cross-sectional view taken along line II-II' of FIG. 3. FIG. 5 is a cross-sectional view taken along line III-III' of FIG. 3. FIG. 6 is a cross-sectional view taken along line IV-IV' of FIG. 3.

Referring to FIGS. 1, 3, 4, 5, and 6, the digitizer 100 according to an exemplary embodiment may include a flexible printed circuit film 200, first lines 300, second lines 400, a filling member 500, a first step compensation layer 600, and a second step compensation layer 700.

The flexible printed circuit film 200 may include an insulating material. For example, the flexible printed circuit film 200 may include polyethersulfone ("PS"), polyacrylate ("PAR"), polyetherimide ("PEI"), polyethylenenaphthalate ("PEN"), polyphenylene Sulfide ("PPS"), polyarylate ("PA"), polycarbonate ("PC"), poly(arylene ethersulfone)), polyethylene terephthalate ("PET"), polyimide ("PI"), and the like. The flexible printed circuit film 200 may prevent the first lines 300 and the second lines 400 from directly contacting each other.

In an exemplary embodiment, the flexible printed circuit film 200 may be disposed in the folding area FA. For example, the flexible printed circuit film 200 may be repeatedly folded and unfolded in the folding area FA.

The first lines 300 may be disposed on a first surface (e.g., an upper surface) of the flexible printed circuit film 200. For example, the first lines 300 may include metal, an alloy, a metal nitride, a conductive metal oxide, a transparent conductive material, and the like. For example, the first lines 300 may include at least one of gold ("Au"), silver ("Ag"), aluminum ("Al"), platinum ("Pt"), nickel ("Ni"), copper ("Cu"), titanium ("Ti"), palladium ("Pd"), magnesium ("Mg"), calcium ("Ca"), lithium ("Li"), chromium ("Cr"), tantalum ("Ta"), molybdenum ("Mo"), scandium ("Sc"), neodymium ("Nd"), iridium ("Ir"), tungsten ("W"), tungsten nitride ("$WN_x$"), titanium nitride ("$TiN_x$"), tantalum nitride ("$TaN_x$"), strontium ruthenium oxide ("$SrRu_xO_y$"), zinc oxide ("$ZnO_x$"), indium tin oxide ("ITO"), tin oxide ("$SnO_x$"), indium oxide ("$InO_x$"), gallium oxide ("$GaO_x$"), indium zinc oxide ("IZO"), and an alloy thereof.

In an exemplary embodiment, the first lines 300 may include first to sixth upper lines 310, 320, 330, 340, 350, and 360. Each of the first to sixth upper lines 310, 320, 330, 340, 350, and 360 may extend in a first direction D1 and may be spaced apart in a second direction D2 crossing the first direction D1. In addition, as shown in FIG. 3, the first and sixth upper lines 310 and 360 may overlap the flat area PA, and the second to fifth upper lines 320, 330, 340, and 350 may overlap the folding area FA.

For example, after a conductive plate including any one of the described-above conductive materials is formed on the flexible printed circuit film 200, the first to sixth upper lines 310, 320, 330, 340, 350, and 360 may be formed by etching the conductive plate.

The second lines 400 may be disposed on a second surface (e.g., a lower surface) opposite to the first surface of the flexible printed circuit film 200. For example, the second lines 400 may include metal, an alloy, a metal nitride, a conductive metal oxide, a transparent conductive material, and the like.

In an exemplary embodiment, the second lines 400 may include first to sixth lower lines 410, 420, 430, 440, 450, and 460. Each of the first to sixth lower lines 410, 420, 430, 440, 450, and 460 may extend in the second direction D2 and may be spaced apart in the first direction D1. In addition, as shown in FIG. 3, a portion of each of the first to sixth lower lines 410, 420, 430, 440, 450, and 460 may overlap the folding area FA, and the remaining portion of each of the first to sixth lower lines 410, 420, 430, 440, 450, and 460 may overlap the flat area PA.

For example, after a conductive plate including any one of the described-above conductive materials is formed under the flexible printed circuit film 200, the first to sixth lower lines 410, 420, 430, 440, 450, and 460 may be formed by etching the conductive plate.

In an exemplary embodiment, a plurality of grid areas may be defined between the first lines 300 extending in the first direction D1 and the second lines 400 extending in the second direction D2, in the flexible printed circuit film 200. For example, as shown in FIG. 3, a grid area MA of the grid areas may be defined by the first upper line 310, the second upper line 320, the first lower line 410, and the second lower line 420. Accordingly, some of the grid areas may overlap the folding area FA, and the rest of the grid areas may overlap the flat area PA.

In an exemplary embodiment, a penetration hole H penetrating the flexible printed circuit film 200 may be formed in the grid area overlapping the folding area FA among the grid areas. For example, the penetration hole H may be formed in each of grid areas overlapping the folding area FA.

In an exemplary embodiment, as shown in FIG. 3, the penetration hole H may have substantially a rectangular shape on a plane. For example, the penetration hole H may be formed by irradiating a laser onto the flexible printed circuit film 200.

As the digitizer 100 includes the flexible printed circuit film 200 in which the penetration hole H is formed, the digitizer 100 may easily be folded and unfolded, and a display quality of the display device 1000 may be improved.

In detail, when a flexible printed circuit film not formed with the penetration hole H is folded by an external force, a repulsive force applied in a direction opposite to the external force may be applied to the flexible printed circuit film. Due to the repulsive force, folding and unfolding of the flexible printed circuit film may be difficult. In addition, a lifting phenomenon may occur in the flexible printed circuit film overlapping the folding area FA, and a pattern caused by the lifting phenomenon may be visually recognized by a user through the window WIN.

However, since the flexible printed circuit film 200 according to an exemplary embodiment includes the penetration hole H therein, the repulsive force applied to the flexible printed circuit film 200 may be relatively weak when folded. Accordingly, folding and unfolding of the flexible printed circuit film 200 may be easily performed and the lifting phenomenon may be suppressed. In this manner, the display quality of the display device 1000 may be improved.

In an exemplary embodiment, the filling member 500 may fill an inside of penetration hole H. For example, the filling member 500 may include a material for reducing the repulsive force. In an exemplary embodiment, the filling member 500 may include substantially the same material as the buffer member CPN. For example, the filling member 500 may include at least one of polyurethane, thermoplastic polyurethane, latex, acrylic resin, polyurethane foam, and polystyrene foam.

The first step compensation layer 600 may be disposed on the first surface of the flexible printed circuit film 200 and may cover the penetration hole H. In addition, the first step compensation layer 600 may cover the first lines 300 together. Accordingly, the first step compensation layer 600 may compensate for a step difference on the first surface due to the penetration hole H and the first lines 300. In particular, the first step compensation layer 600 may cover the penetration hole H and the first lines 300, and may provide a substantially flat top surface.

The second step compensation layer 700 may be disposed on the second surface of the flexible printed circuit film 200 and may cover the penetration hole H. In addition, the second step compensation layer 700 may cover the second lines 400 together. Accordingly, the second step compensation layer 700 may compensate for a step difference on the second surface due to the penetration hole H and the second lines 400. In particular, the second step compensation layer 700 may cover the penetration hole H and the second lines 400, and may provide a substantially flat lower surface.

In an exemplary embodiment, each of the first and second step compensation layers 600 and 700 may include substantially the same material as the filling member 500. For example, the filling member 500, the first step compensation layer 600, and the second step compensation layer 700 may be integrally formed.

As the digitizer 100 includes first and second step compensation layers 600 and 700 for flattening the upper and lower surfaces of the digitizer 100, a pattern of the penetration hole H, the first lines 300, and the second lines 400 may not be visually recognized by the user through the window WIN. Accordingly, the display quality of the display device 1000 may be further improved.

As shown in FIG. 6, the first lines 300 may be disposed on the first surface of the flexible printed circuit film 200, and the second lines 400 may be disposed on the second surface of the flexible printed circuit film 200. The first lines 300 and the second lines 400 may not contact each other by the flexible printed circuit film 200 therebetween.

The input unit 2000 may include a resonance circuit having a capacitor and a coil. For example, a magnetic field or an electromagnetic field emitted from the input unit 2000 may affect a capacitance formed between the first and second lines 300 and 400. Accordingly, the digitizer 100 may detect a position where the input unit 2000 is close to. In addition, the digitizer 100 may generate a magnetic field or an electromagnetic field by a current input to the first and second lines 300 and 400. The magnetic field or the electromagnetic field emitted from the digitizer 100 may affect the input unit 2000. Accordingly, the digitizer 100 and the input unit 2000 may communicate with each other to perform various input functions.

Figure 7:
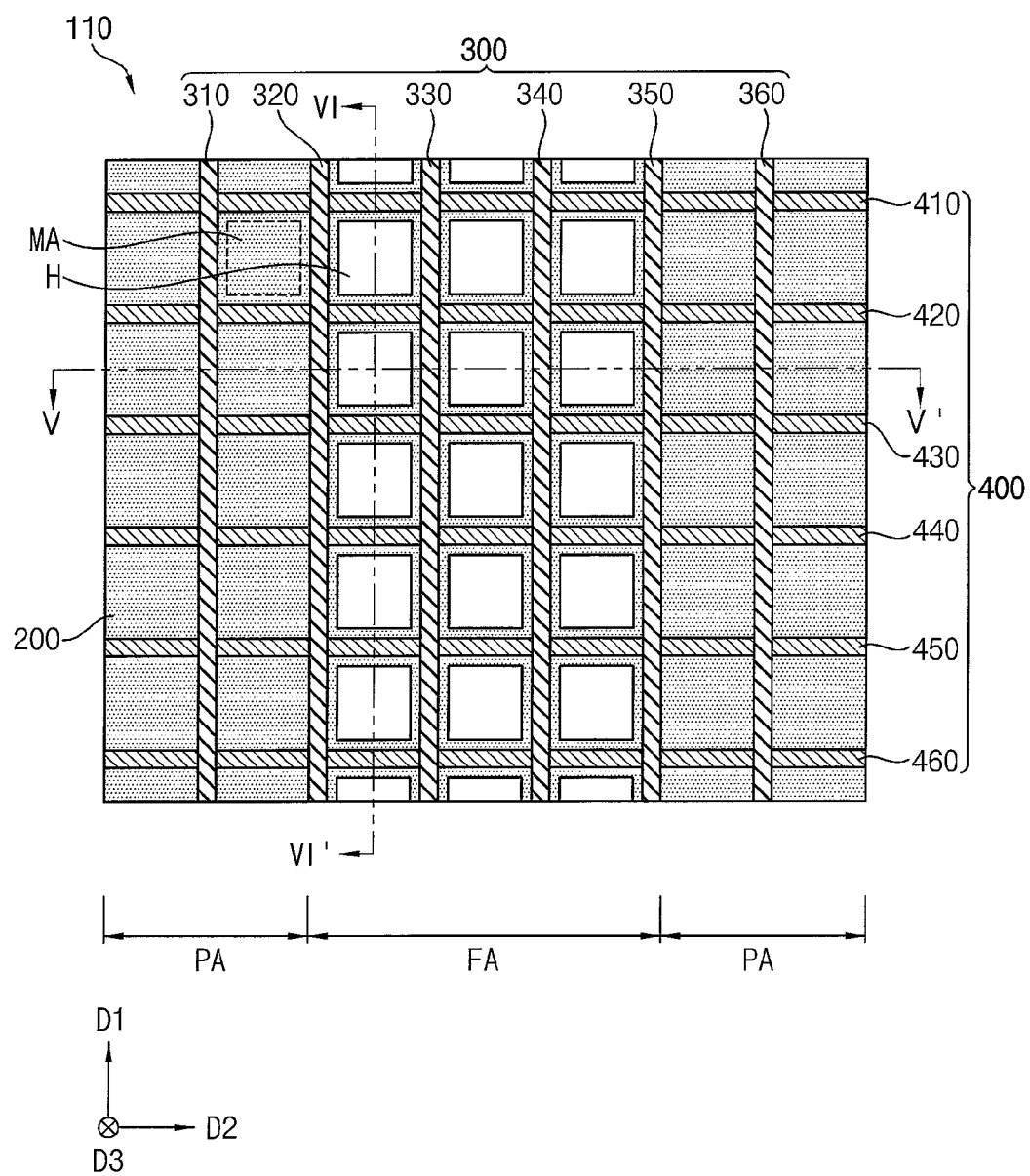
FIG. 7 is a plan view of a digitizer included in the display device of FIG. 1 according to another exemplary embodiment.
Figure 8:
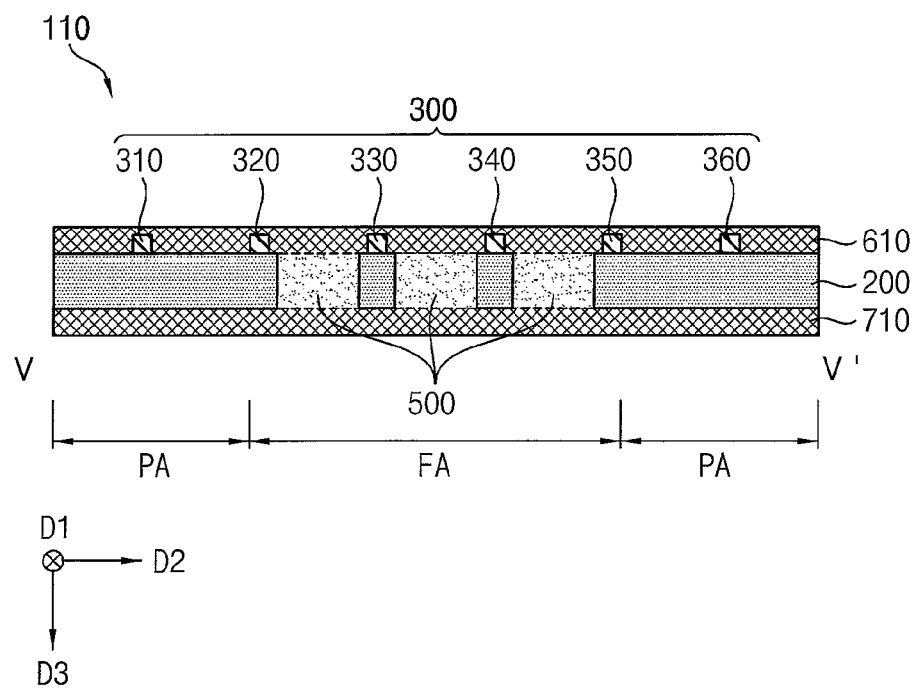
FIG. 8 is a cross-sectional view taken along line V-V' of FIG. 7.
Figure 9:
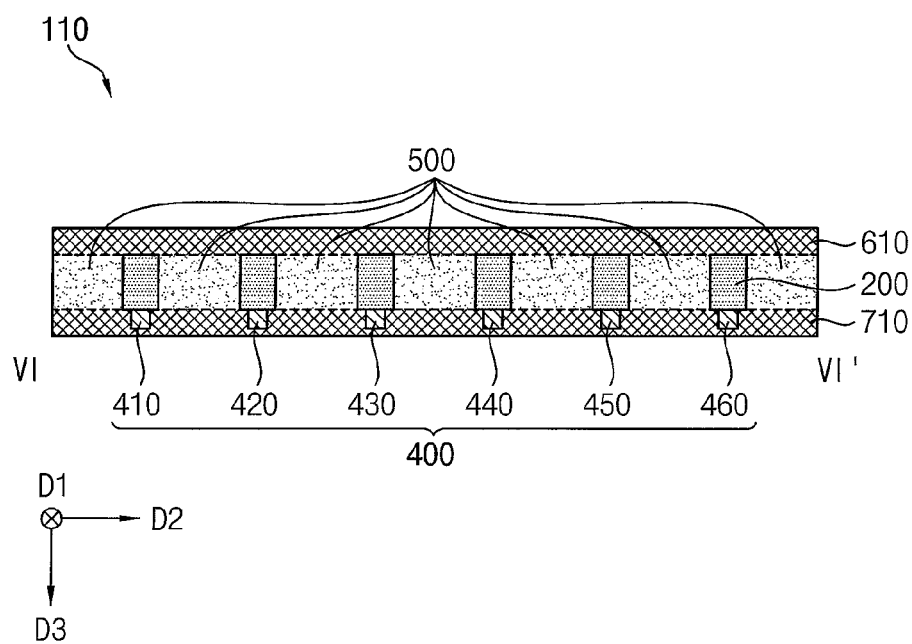
FIG. 9 is a cross-sectional view taken along line VI-VI' of FIG. 7.

FIG. 7 is a plan view illustrating a digitizer included in the display device of FIG. 1 according to another exemplary embodiment. FIG. 8 is a cross-sectional view taken along line V-V' of FIG. 7. FIG. 9 is a cross-sectional view taken along line VI-VI' of FIG. 7.

Referring to FIGS. 1, 7, 8, and 9, a digitizer 110 according to the illustrated exemplary embodiment may include a flexible printed circuit film 200, first lines 300, second lines 400, filling member 500, and a first step compensation layer 610, and a second step compensation layer 710. The digitizer 110 according to the illustrated exemplary embodiment is substantially the same as the digitizer 100 described above, except for the first step compensation layer 610 and the second step compensation layer 710. As such, the first step compensation layer 610 and the second step compensation layer 710 will be mainly described, and repeated descriptions of the substantially the same elements will be omitted.

In an exemplary embodiment, each of the first and second step compensation layers 610 and 710 may include an adhesive. For example, the adhesive may include at least one of an optically transparent adhesive ("OCA"), an optically transparent resin ("OCR"), and a pressure sensitive adhesive ("PSA"). In particular, the filling member 500 according to the illustrated exemplary embodiment may include a thermoplastic polyurethane ("TPU"), and each of the first and second step compensation layers 610 and 710 may include a pressure-sensitive adhesive ("PSA"). Accordingly, an adhesion of the digitizer 110 may be improved, and a reliability of the display device 1000 may be improved.

Figure 10:
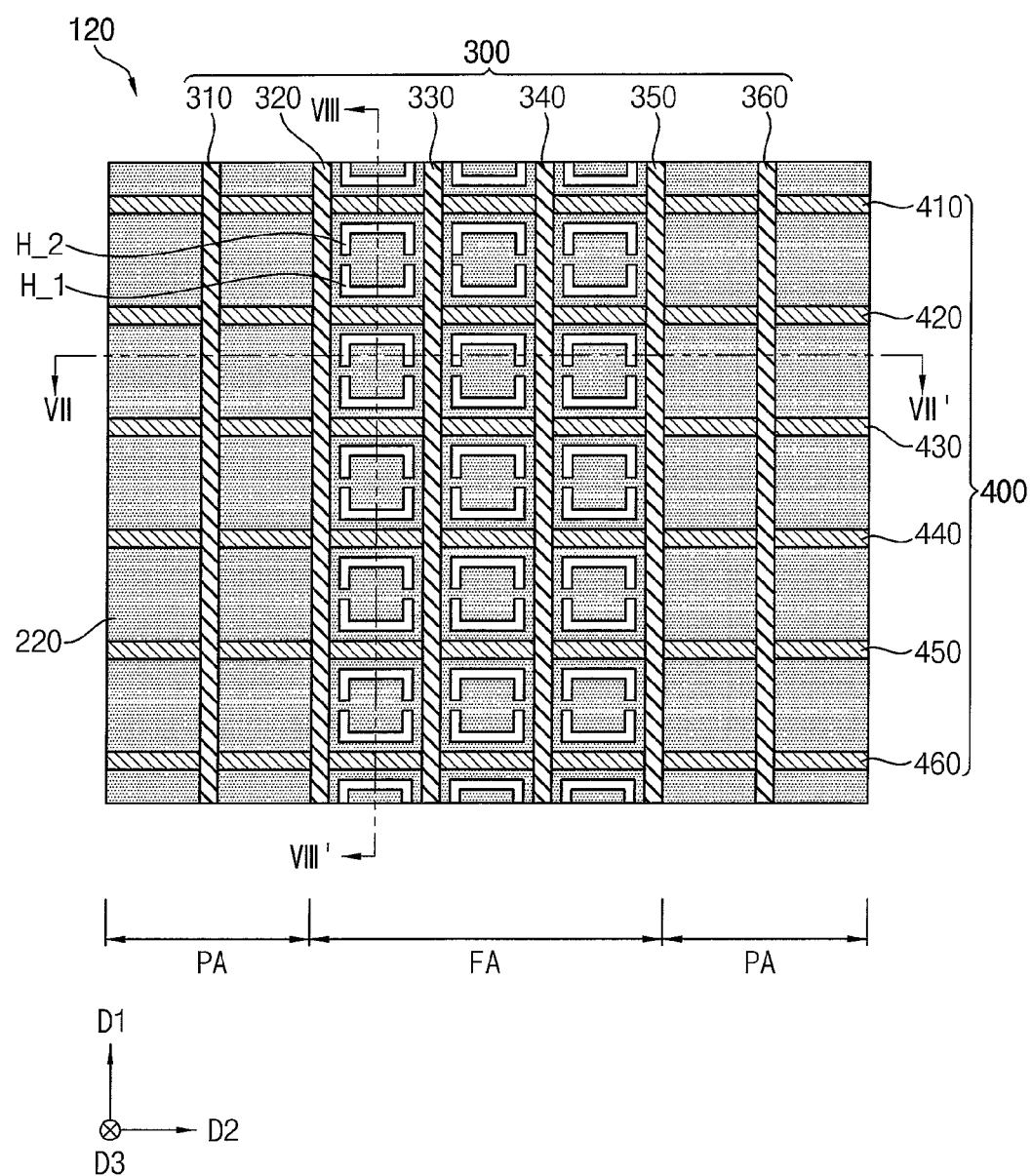
FIG. 10 is a plan view of a digitizer included in the display device of FIG. 1 according to another exemplary embodiment.
Figure 11:
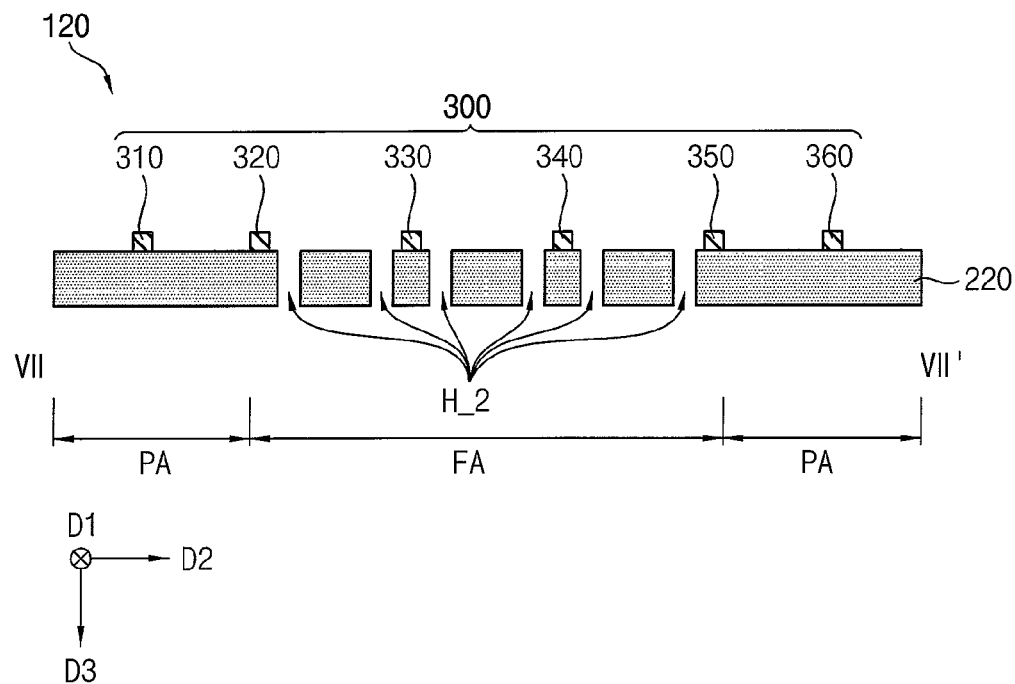
FIG. 11 is a cross-sectional view taken along line VII-VII' of FIG. 10.
Figure 12:
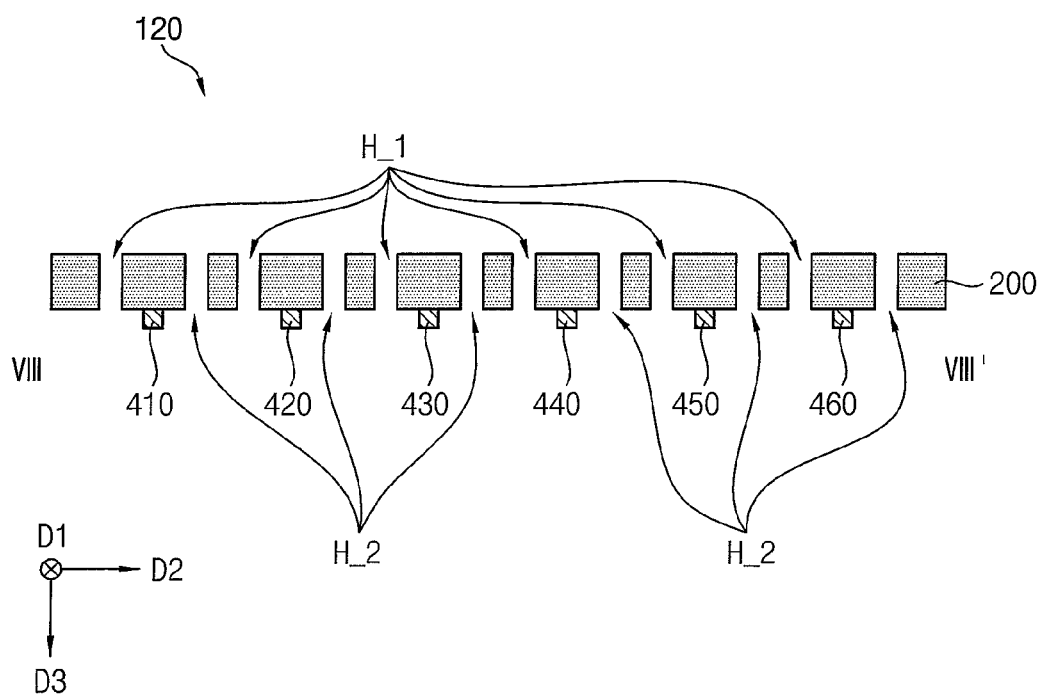
FIG. 12 is a cross-sectional view taken along line VIII-VIII' of FIG. 10.

FIG. 10 is a plan view of a digitizer included in the display device of FIG. 1 according to another exemplary embodiment. FIG. 11 is a cross-sectional view taken along line VII-VII' of FIG. 10. FIG. 12 is a cross-sectional view taken along line VIII-VIII' of FIG. 10.

Referring to FIGS. 1, 10, 11 and 12, the digitizer 120 according to the illustrated exemplary embodiment may include a flexible printed circuit film 220, first lines 300, and second lines 400. The digitizer 120 according to the illustrated exemplary embodiment is substantially the same as the digitizer 100 described above. In particular, the first lines 300 and the second lines 400 of the digitizer 120 are substantially the same as those of the digitizer 100 described above. As such, repeated descriptions and configuration of substantially the same elements of the digitizer will be omitted, and differences therebetween will be mainly described.

In an exemplary embodiment, a first penetration hole H_1 and a second penetration hole H_2 penetrating the flexible printed circuit film 220 may be formed in the grid area overlapping the folding area FA among the grid areas. For example, the first and second penetration holes H_1 and H_2 may be formed in each of the grid areas overlapping the folding area FA. As shown in FIG. 10, the first penetration hole H_1 may have substantially a U-shape on a plane, and the second penetration hole H_2 may have a shape substantially symmetrical with that of the first penetration hole H_1 with respect to a center of the grid area.

The size of each of the first and second penetration holes H_1 and H_2 of the digitizer 120 may be less than a size of the penetration hole H of the digitizer 100 having substantially a rectangular shape on a plane. Accordingly, the digitizer 120 according to the illustrated exemplary embodiment may not include the filling member 500, the first step compensation layer 600, and the second step compensation layer 700 of the digitizer 100 described above. Accordingly, an efficiency of a process for manufacturing the digitizer 120 may be improved. However, the inventive concepts are not limited thereto, and in some exemplary embodiments, the digitizer 120 may include at least one of the filling member 500, the first step compensation layer 600, and the second step compensation layer 700 of the digitizer 100.

Figure 13:
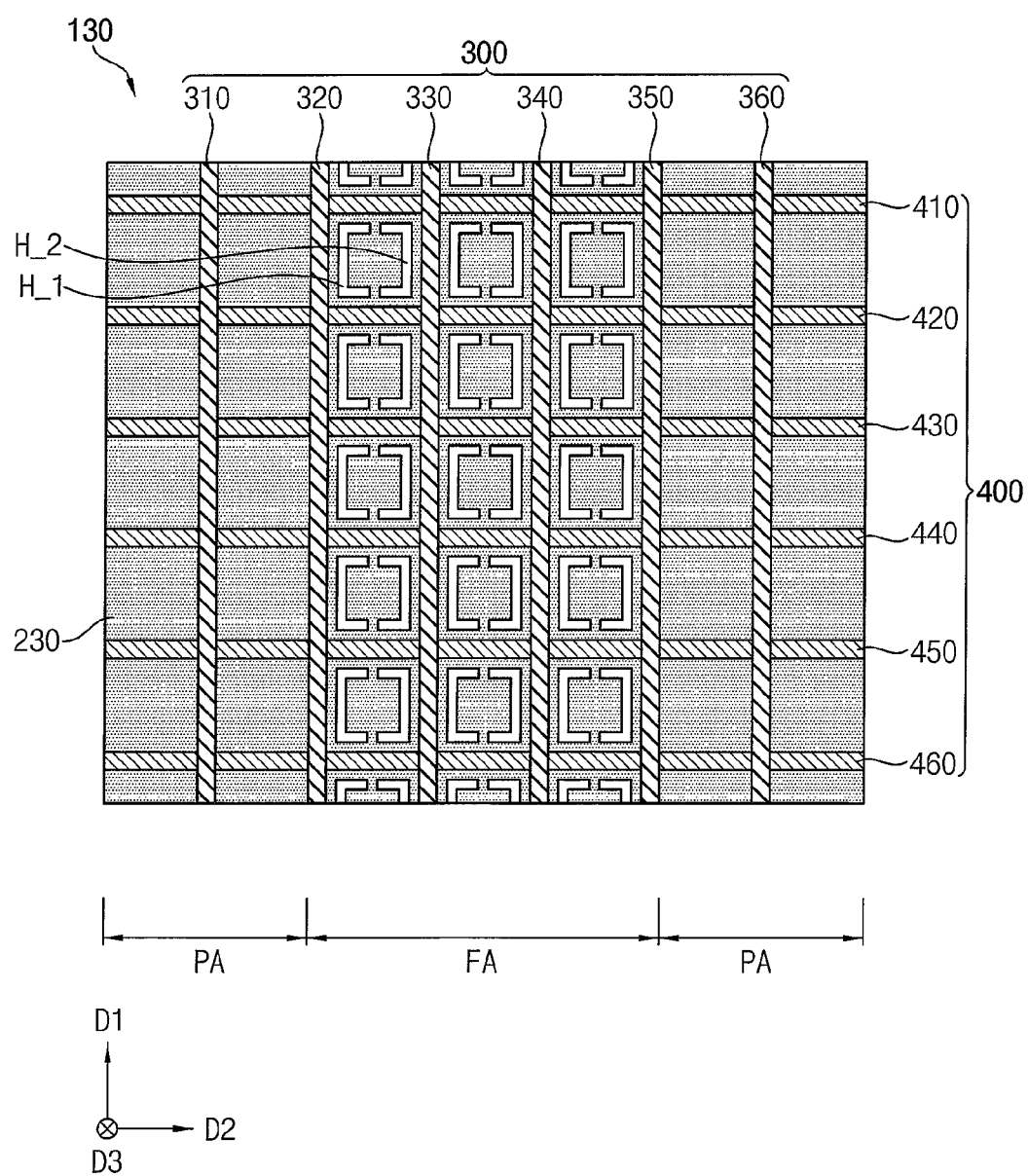
FIG. 13 is a plan view of a digitizer included in the display device of FIG. 1 according to another exemplary embodiment.

FIG. 13 is a plan view of a digitizer included in the display device of FIG. 1 according to another exemplary embodiment.

Referring to FIGS. 1 and 13, the digitizer 130 may include a flexible printed circuit film 230, first lines 300, and second lines 400. The digitizer 130 according to the illustrated exemplary embodiment is substantially the same as the digitizer 100 described above. In particular, the first lines 300 and the second lines 400 of the digitizer 120 are substantially the same as those of the digitizer 100 described above. As such, repeated descriptions and configuration of substantially the same elements of the digitizer 130 will be omitted, and differences therebetween will be mainly described.

In an exemplary embodiment, a first penetration hole H_1 and a second penetration hole H_2 penetrating the flexible printed circuit film 230 may be formed in the grid area overlapping the folding area FA among the grid areas. For example, the first and second penetration holes H_1 and H_2 may be formed in each of the grid areas overlapping the folding area FA. As shown in FIG. 13, the first penetration hole H_1 may have substantially a U-shape on a plane, and the second penetration hole H_2 may have a shape substantially symmetrical with that of the first penetration hole H_1 with respect to a center of the grid area.

The size of each of the first and second penetration holes H_1 and H_2 of the digitizer 130 may be less than a size of the penetration hole H of the digitizer 100 having substantially a rectangular shape on a plane. Accordingly, the digitizer 130 according to the illustrated exemplary embodiment may not include the filling member 500, the first step compensation layer 600, and the second step compensation layer 700 of the digitizer 100 described above. Accordingly, an efficiency of a process for manufacturing the digitizer 130 may be improved. However, the inventive concepts are not limited thereto, and in some exemplary embodiments, the digitizer 130 may include at least one of the filling member 500, the first step compensation layer 600, and the second step compensation layer 700 of the digitizer 100.

Figure 14:
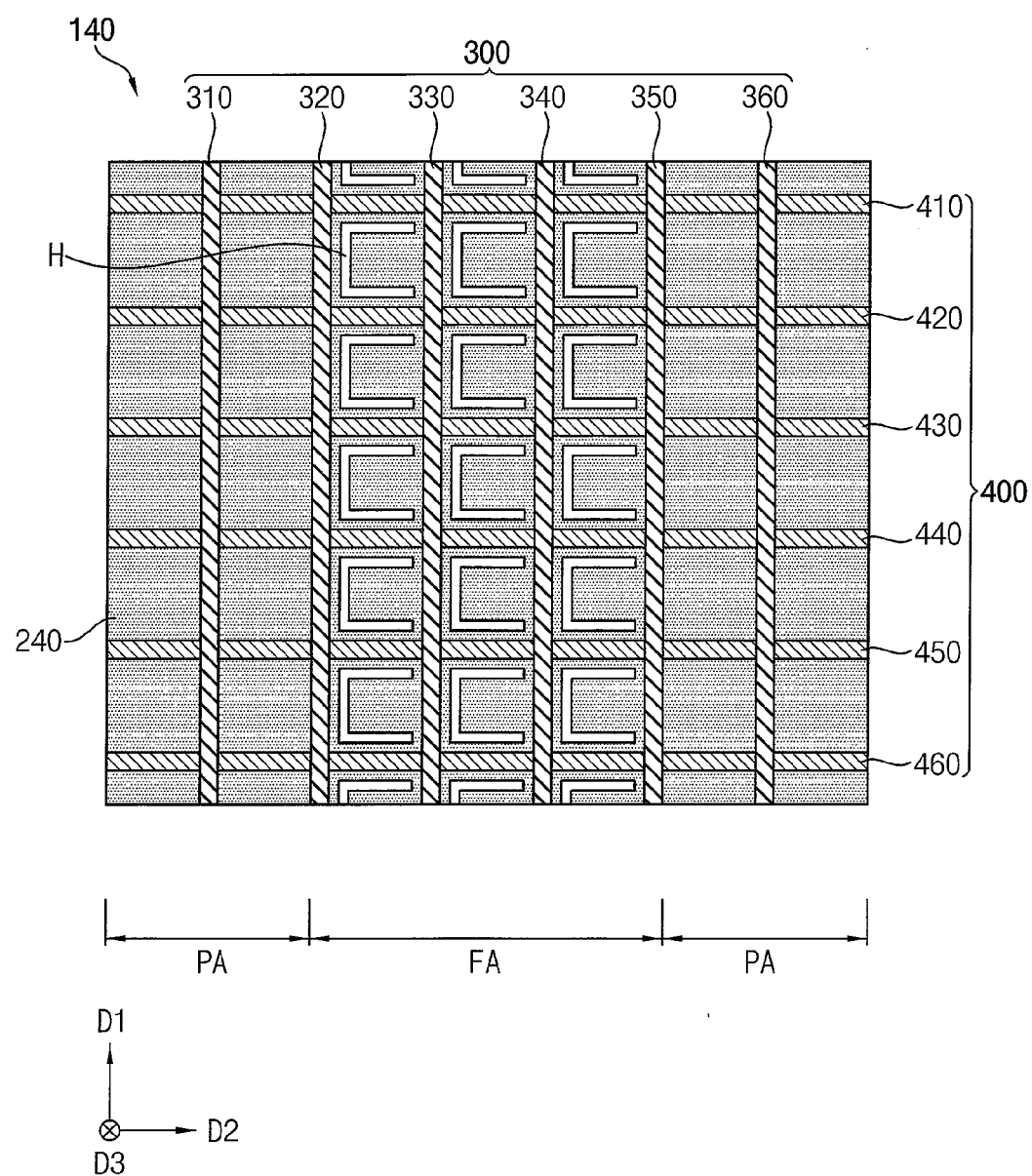
FIG. 14 is a plan view of a digitizer included in the display device of FIG. 1 according to another exemplary embodiment.

FIG. 14 is a plan view of a digitizer included in the display device of FIG. 1 according to another exemplary embodiment.

Referring to FIGS. 1 and 14, the digitizer 140 may include a flexible printed circuit film 240, first lines 300, and second lines 400. The digitizer 140 according to the illustrated exemplary embodiment is substantially the same as the digitizer 100 described above. In particular, the first lines 300 and the second lines 400 of the digitizer 120 are substantially the same as those of the digitizer 100 described above. As such, repeated descriptions and configuration of substantially the same elements of the digitizer 140 will be omitted, and differences therebetween will be mainly described.

In an exemplary embodiment, a penetration hole H penetrating the flexible printed circuit film 240 may be formed in the grid area overlapping the folding area FA among the grid areas. For example, the penetration hole H may be formed in each of the grid areas overlapping the folding area FA. As shown in FIG. 14, the penetration hole H may have substantially a U-shape on a plane.

The size of each of the penetration hole H of the digitizer 140 may be less than a size of the penetration hole H of the digitizer 100 having substantially a rectangular shape on a plane. Accordingly, the digitizer 140 may not include the filling member 500, the first step compensation layer 600, and the second step compensation layer 700 of the digitizer 100 described above. Accordingly, an efficiency of a process for manufacturing the digitizer 140 may be improved. However, the inventive concepts are not limited thereto, and in some exemplary embodiments, the digitizer 140 may include at least one of the filling member 500, the first step compensation layer 600, and the second step compensation layer 700 of the digitizer 100.

A digitizer according to exemplary embodiments include a flexible printed circuit film penetrated by a penetration hole. As such, the digitizer may relatively weaken a repulsive force applied to the flexible printed circuit film. Accordingly, folding and unfolding of the flexible printed circuit film may be easily performed, and a lifting phenomenon of the flexible printed circuit film may be suppressed, so that display quality of a display device including the digitizer may be improved.

In addition, the digitizer according to one or more exemplary embodiments includes first and second step compensation layers for flattening upper and lower surfaces of the digitizer, so that a step difference due to the penetration hole is not visually recognized by a user. Accordingly, a display quality of the display device may be further improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A digitizer comprising:
   a flexible printed circuit film including a folding area configured to be folded, and having a first surface and a second surface opposite to the first surface;
   a plurality of first lines disposed on the first surface of the flexible printed circuit film and extending in a first direction; and
   a plurality of second lines disposed on the second surface of the flexible printed circuit film and extending in a second direction crossing the first direction,
   wherein:
   the first lines and the second lines define a grid area overlapping the folding area on a plane; and
   the flexible printed circuit film includes a penetration hole in the grid area.

2. The digitizer of claim 1, wherein the penetration hole has substantially a rectangular shape on a plane.

3. The digitizer of claim 1, further comprising a first step compensation layer disposed on the first surface of the flexible printed circuit film and covering the penetration hole.

4. The digitizer of claim 3, further comprising a filling member disposed inside of the penetration hole.

5. The digitizer of claim 4, wherein the filling member includes at least one of polyurethane, thermoplastic polyurethane, latex, acrylic resin, polyurethane foam, and polystyrene foam.

6. The digitizer of claim 4, wherein the first step compensation layer includes substantially the same material as the filling member.

7. The digitizer of claim 3, wherein the first step compensation layer includes an adhesive.

8. The digitizer of claim 7, wherein the adhesive includes at least one of an optically transparent adhesive, an optically transparent resin, and a pressure-sensitive adhesive.

9. The digitizer of claim 3, wherein the first compensation layer further covers the first lines.

10. The digitizer of claim 3, further comprising a second compensation layer disposed on the second surface of the flexible printed circuit film and covering the penetration hole.

11. The digitizer of claim 1, wherein the penetration hole includes:
a first penetration hole having substantially a U-shape on a plane; and
a second penetration hole having a shape substantially symmetrical to the first penetration hole with respect to a center of the grid area.

12. A display device comprising:
a display panel including a substrate and a display structure disposed on the substrate; and
a digitizer disposed under the display panel, the digitizer including:
a flexible printed circuit film including a folding area configured to be folded;
a plurality of first lines disposed on the flexible printed circuit film and extending in a first direction; and
a plurality of second lines disposed under the flexible printed circuit film and extending in a second direction crossing the first direction,
wherein:
the first lines and the second lines define a grid area overlapping the folding area on a plane; and
the flexible printed circuit film includes a penetration hole in the grid area.

13. The display device of claim 12, wherein the penetration hole has substantially a rectangular shape on a plane.

14. The display device of claim 12, wherein the digitizer further includes a first step compensation layer disposed on a first surface of the flexible printed circuit film and covering the penetration hole.

15. The display device of claim 14, wherein the digitizer further includes a filling member disposed inside of the penetration hole.

16. The display device of claim 15, wherein the first step compensation layer includes substantially the same material as the filling member.

17. The display device of claim 14, wherein the first step compensation layer includes an adhesive.

18. The display device of claim 14, wherein the digitizer further includes a second compensation layer disposed on a second surface of the flexible printed circuit film and covering the penetration hole.

19. The display device of claim 12, further comprising a touch panel disposed on the display panel.

20. The display device of claim 12, further comprising:
a protection film disposed between the display panel and the digitizer;
a buffer member disposed between the protection film and the digitizer; and
a support member disposed under the digitizer and including a plurality of slits in an area overlapping the folding area.

* * * * *